(12) United States Patent
Ma et al.

(10) Patent No.: US 8,860,194 B2
(45) Date of Patent: Oct. 14, 2014

(54) BUCK CONVERTER POWER PACKAGE

(71) Applicants: Ling Ma, Redondo Beach, CA (US); Andrew N. Sawle, E. Grinstead (GB); David Paul Jones, South Glamorgan (GB); Timothy D. Henson, Torrance, CA (US); Niraj Ranjan, El Segundo, CA (US); Vijay Viswanathan, Apex, NC (US); Omar Hassen, Irvine, CA (US)

(72) Inventors: Ling Ma, Redondo Beach, CA (US); Andrew N. Sawle, E. Grinstead (GB); David Paul Jones, South Glamorgan (GB); Timothy D. Henson, Torrance, CA (US); Niraj Ranjan, El Segundo, CA (US); Vijay Viswanathan, Apex, NC (US); Omar Hassen, Irvine, CA (US)

(73) Assignee: International Rectifier Corporation, El Segundo, CA (US)

( * ) Notice: Subject to any disclaimer, the term of this patent is extended or adjusted under 35 U.S.C. 154(b) by 163 days.

(21) Appl. No.: 13/666,854

(22) Filed: Nov. 1, 2012

(65) Prior Publication Data

US 2014/0118032 A1 May 1, 2014

(51) Int. Cl.
*H01L 23/495* (2006.01)

(52) U.S. Cl.
USPC .......... 257/676; 257/691; 257/724; 257/732; 257/E23.031

(58) Field of Classification Search
USPC ............... 257/676, 691, 724, 732, E23.031
See application file for complete search history.

(56) References Cited

U.S. PATENT DOCUMENTS

| 8,426,952 | B2* | 4/2013 | Cho et al. | 257/666 |
| 8,497,574 | B2* | 7/2013 | Cho et al. | 257/676 |
| 8,674,497 | B2* | 3/2014 | Cho et al. | 257/691 |
| 8,680,627 | B2* | 3/2014 | Cho et al. | 257/401 |

* cited by examiner

*Primary Examiner* — Minh-Loan T Tran
(74) *Attorney, Agent, or Firm* — Farjami & Farjami LLP

(57) ABSTRACT

One exemplary disclosed embodiment comprises a semiconductor package including a vertical conduction control transistor and a vertical conduction sync transistor. The vertical conduction control transistor may include a control source, a control gate, and a control drain that are all accessible from a bottom surface, thereby enabling electrical and direct surface mounting to a support surface. The vertical conduction sync transistor may include a sync drain on a top surface, which may be connected to a conductive clip that is coupled to the support surface. The conductive clip may also be thermally coupled to the control transistor. Accordingly, all terminals of the transistors are readily accessible through the support surface, and a power circuit, such as a buck converter power phase, may be implemented through traces of the support surface. Optionally, a driver IC may be integrated into the package, and a heatsink may be attached to the conductive clip.

21 Claims, 2 Drawing Sheets

BUCK CONVERTER POWER PACKAGE

BACKGROUND OF THE INVENTION

The present application claims the benefit of and priority to a pending provisional application entitled "Vertical Conduction Buck Converter Package," Ser. No. 61/618,628 filed on Mar. 30, 2012. The disclosure in this pending provisional application is hereby incorporated fully by reference into the present application.

1. Field of the Invention

The present invention relates generally to semiconductor devices. More particularly, the present invention relates to packaging of semiconductor devices.

2. Background Art

Conventionally, power circuits such as DC-DC power conversion circuits may be implemented using separate discrete components. However, in order to optimize form factor, performance, and manufacturing cost, it is often desirable to integrate multiple components of a power circuit into a single compact package. Thus, several package designs have been developed to integrate multiple transistors, such as a control transistor and a synchronous transistor of a buck converter power phase, into a single compact package.

To provide sufficient electrical performance for the reliable operation of high power semiconductor packages, it is crucial to ensure high current carrying capacity and low resistance of the transistors within the package. Additionally, for long-term package reliability, it is essential to provide proper thermal dissipation.

It is known to use a stacked configuration to combine a control transistor and a synchronous transistor into a single high power semiconductor package. However, the stacked configuration is not ideal from a thermal management perspective, as heat from a lower transistor is emitted directly to an upper transistor stacked on top. Moreover, due to differing die sizes, electrode positions, and required die orientations of the control transistor and the synchronous transistor, various design workarounds may be required to connect the stacked package, increasing cost and complexity. Further, the stacked configuration may not provide sufficient space for a driver integrated circuit (IC).

To avoid the above connection issues, it is known to use planar or lateral structure transistors, which provide access to all electrodes on a single side of a transistor. However, planar transistors may not provide sufficient current carrying capacity for high power applications. Additionally, the use of planar transistors may undesirably increase package form factor, complexity, and cost.

Thus, a unique and cost-effective solution is needed to support the efficient design and operation of high power semiconductor packages, such as for buck converter power phases, with enhanced thermal dissipation and a compact form factor.

SUMMARY OF THE INVENTION

A buck converter power package, substantially as shown in and/or described in connection with at least one of the figures, and as set forth more completely in the claims.

DETAILED DESCRIPTION OF THE INVENTION

The present application is directed to a vertical conduction buck converter power phase package. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the invention, which use the principles of the present invention, are not specifically described in the present application and are not specifically illustrated by the present drawings.

Figure 1:
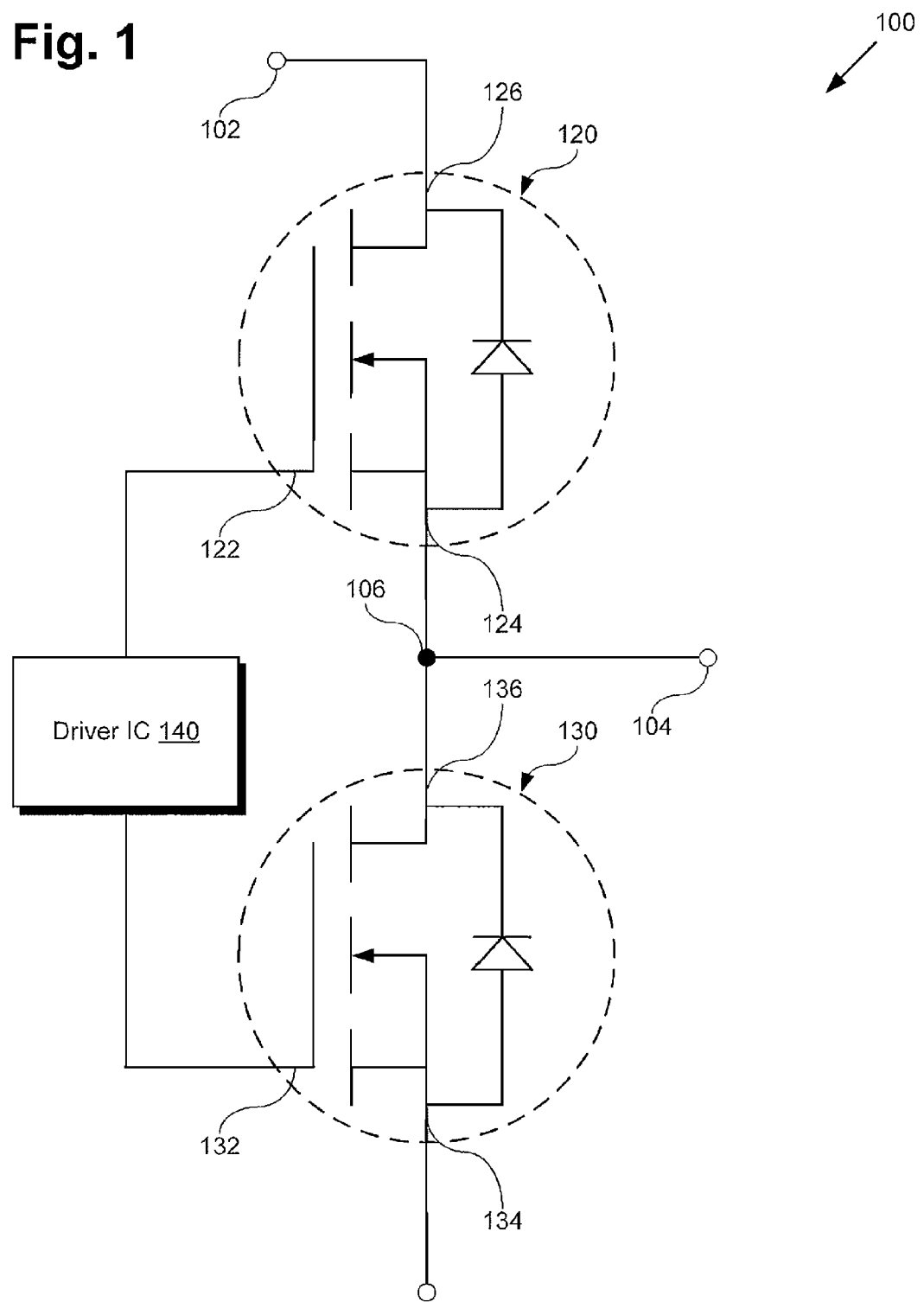
FIG. 1 illustrates a circuit diagram of a buck converter power phase.

FIG. 1 illustrates a circuit diagram of a buck converter power phase. Diagram 100 includes input node 102, output node 104, switched node 106, control transistor 120, synchronous ("sync") transistor 130, and driver integrated circuit (IC) 140. Control transistor 120 includes control gate 122, control source 124, and control drain 126. Sync transistor 130 includes sync gate 132, sync source 134, and sync drain 136. Control transistor 120 and sync transistor 130 may each comprise a field effect transistor (FET) such as a MOSFET including a body diode. Control source 124 is coupled to sync drain 136 at switched node 106. Driver IC 140 controls the duty cycles of control transistor 120 using control gate 122 and sync transistor 130 using sync gate 132, thereby converting an input voltage at input node 102 to a specific output voltage at output node 104. Thus, the circuit of diagram 100 may implement a power phase of a buck converter, for example in a single or multi-phase DC-DC power converter.

Conventionally, the circuit of diagram 100 may be implemented using discrete components, for example by individually packaging control transistor 120, sync transistor 130 and driver IC 140, and by making circuit interconnections through a support surface. However, as discussed above, it may be desirable to implement the circuit of diagram 100 in a compact and integrated package.

Figure 2A:
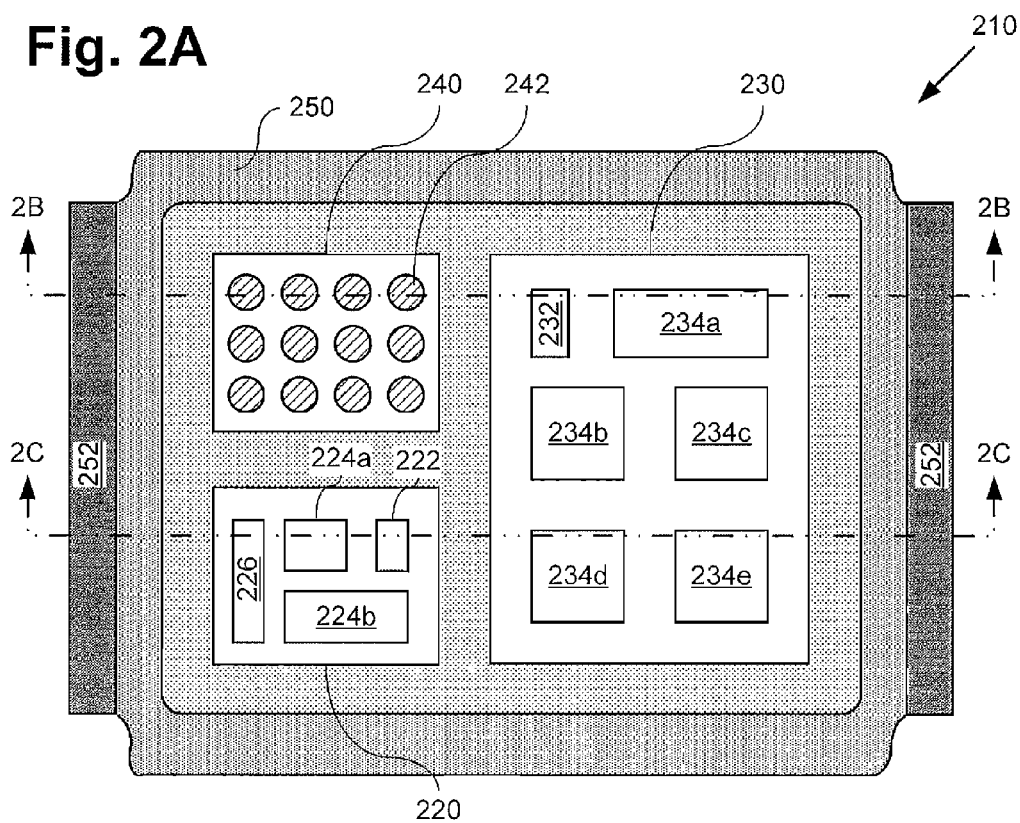
FIG. 2A illustrates a bottom view of a vertical conduction buck converter power phase package according to an embodiment of the invention.

Accordingly, turning to FIG. 2A, FIG. 2A illustrates a bottom view of a vertical conduction buck converter power phase package according to an embodiment of the invention. Package 210 of FIG. 2A includes control transistor 220, sync transistor 230, driver IC 240, and conductive clip 250. Control transistor 220 includes control gate pad 222, control source pads 224a and 224b, and control drain pad 226. Sync transistor 230 includes sync gate pad 232 and sync source pads 234a, 234b, 234c, 234d and 234e. Driver IC 240 includes a plurality of solder bumps including solder bump 242. Thus, driver IC 240 may comprise a flip-chip. Conductive clip 250 includes a peripheral rim surface 252. For clarity, a support surface is omitted from the bottom view of FIG. 2A.

As shown in FIG. 2A, all the components of circuit diagram 100 in FIG. 1 are thus integrated into a single integrated package 210. Accordingly, control transistor 220 may correspond to control transistor 120 from FIG. 1, sync transistor 230 may correspond to sync transistor 130 from FIG. 1, and driver IC 240 may correspond to driver IC 140 from FIG. 1. The circuit connections shown in diagram 100 of FIG. 1 may be provided through traces of a support surface, as discussed below in conjunction with FIGS. 2B and 2C.

Both control transistor 220 and sync transistor 230 may comprise vertical conduction devices, such as trench type power MOSFETs. In a conventional vertical conduction device, a drain connection may only be accessible through a top surface thereof. However, as shown by the presence of control drain pad 226, control transistor 220 also provides access to a drain connection on a bottom surface thereof. For example, an implant sinker, a moat trench, or another method may be utilized to electrically couple a topside drain with control drain pad 226 on the bottom surface. Since conductive clip 250 may be electrically coupled to the drain of sync transistor 230, the top side drain of control transistor 220 may be electrically isolated from conductive clip 250 using an insulating material such as a non-conductive epoxy, as described below in conjunction with FIG. 2C.

Although FIG. 2A shows package 210 integrated with driver IC 240, alternative embodiments may omit driver IC 240 from package 210. Additionally, while FIG. 2A shows a surface mount package using a conductive clip 250, alternative embodiments may use other package designs such as Quad Flat No leads (QFN) package or a custom package design. Furthermore, the relative positioning of control transistor 220, sync transistor 230, and driver IC 240 in FIG. 2A is merely exemplary. Alternative embodiments may reposition and/or rotate the dies of the package for facilitated integration. Alternative pad layouts may also be utilized. For example, instead of arranging sync source pads 234a through 234e in a grid arrangement as shown in FIG. 2A, alternative embodiments may use a single large pad or another pad arrangement.

Figure 2B:
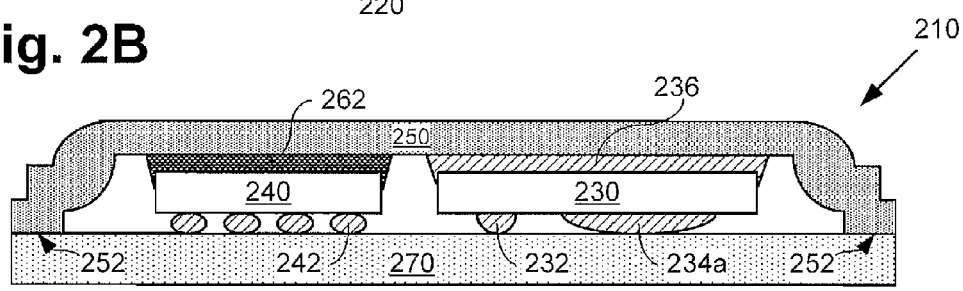
FIG. 2B illustrates a cross sectional view of a vertical conduction buck converter power phase package according to an embodiment of the invention.

Turning to FIG. 2B, FIG. 2B illustrates a cross sectional view of a vertical conduction buck converter power phase package according to an embodiment of the invention. The cross section shown in FIG. 2B may correspond to the cross sectional line indicated by line 2B-213 of FIG. 2A. Package 210 of FIG. 2B includes driver IC 240, sync transistor 230, conductive clip 250, and support surface 270.

Driver IC 240 is attached to conductive clip 250 by non-conductive epoxy 262. While attachment by conductive epoxy may also be possible since driver IC 240 may comprise a flip chip without topside connections, the use of non-conductive epoxy 262 may be preferred for noise isolation and other reasons. Solder bumps, including solder bump 242, provide various connections for driver IC 240 through support surface 270. Support surface 270 may comprise any support surface such as, but not limited to, a ceramic substrate, a direct bonded copper (DBC) substrate, a leadframe, or a printed circuit board (PCB). Additionally, support surface 270 may comprise a flat or planar support surface. Traces on or within support surface 270 may provide the necessary interconnections to complete the circuit of package 210. For example, a trace may couple solder bump 242 to solder bump 232 corresponding to sync gate pad 232 from FIG. 2A.

Turning to sync transistor 230, conductive epoxy 236 may couple the topside drain of sync transistor 230 to conductive clip 250. Thus, the drain of sync transistor 230 is electrically coupled to peripheral rim surface 252 of conductive clip 250, which in turn is coupled to support surface 270. On the bottom side, solder bump 232 corresponding to sync gate pad 232 from FIG. 2A and solder bump 234a corresponding to sync source pad 234a from FIG. 2A are electrically and directly surface mounted on support surface 270. The term "directly" here indicates that the solder bumps may be mechanically coupled to support surface 270 without the use of intermediary structures such as a bond wire or a conductive clip. As previously discussed, solder bumps 242 and 232 may be coupled through a trace in support surface 270, allowing driver IC 240 to control the duty cycle of sync transistor 230. Similarly, a trace in support surface 270 may connect solder bump 234a outside of package 210, and additional traces may connect the other solder bumps of driver IC 240.

Figure 2C:
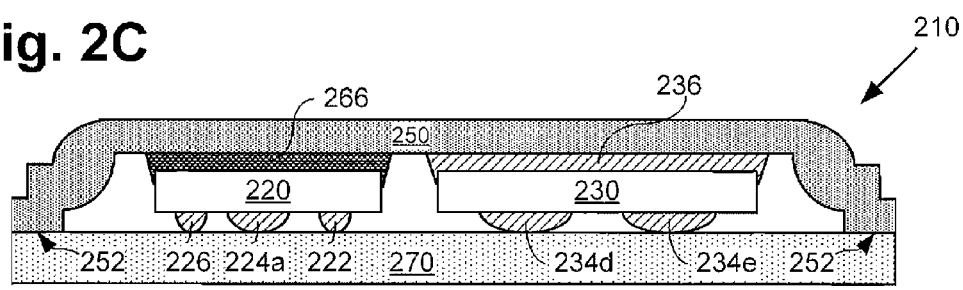
FIG. 2C illustrates a cross sectional view of a vertical conduction buck converter power phase package according to an embodiment of the invention.

Moving to FIG. 2C, FIG. 2C illustrates a cross sectional view of a vertical conduction buck converter power phase package according to an embodiment of the invention. The cross section shown in FIG. 2C may correspond to the cross sectional line indicated by line 2C-2C of FIG. 2A. Package 210 of FIG. 2C includes control transistor 220, sync transistor 230, conductive clip 250, and support surface 270.

Control transistor 220 is attached to conductive clip 250 by non-conductive epoxy 266, thus insulating the topside drain connection of control transistor 220 from conductive clip 250 and the drain connection of sync transistor 230. The non-conductive epoxy 266 may be thermally conductive, providing heat dissipation for control transistor 220 through conductive clip 250. Optionally, a heatsink may be attached to the top of conductive clip 250. On the bottom side, solder bump 226 corresponding to control drain pad 226 from FIG. 2A, solder bump 224a corresponding to control source pad 224a from FIG. 2A, and solder bump 222 corresponding to control gate pad 222 from FIG. 2A are electrically and directly surface mounted on support surface 270. As previously described, "directly" indicates that the solder bumps may be mechanically coupled to support surface 270 without using a bond wire or a conductive clip, such as conductive clip 250. Thus, for example, solder bump 226 corresponding to control drain pad 226 from FIG. 2A may be directly attached to support surface 270 using only solder.

Thus, all of the terminals of control transistor 220 are easily accessible from the bottom surface of control transistor 220. Accordingly, connecting the circuit of FIG. 1 using package 210 is readily accomplished. For example, solder bump 222 may be connected through a trace in support surface 270 to a solder bump of driver IC 240, allowing driver IC 240 to control the duty cycle of control transistor 220. Solder bump 224a may be connected through an output trace in support surface 270 to peripheral rim surface 252, thereby connecting control transistor 220 and sync transistor 230 at switched node 106 in FIG. 1. Further, the switched node 106 is further connected to an output node 104 so that the output trace provides an output of the buck converter package. Solder bump 226 may be connected through an input trace in support surface 270 to a voltage source, thereby connecting control transistor 220 to input node 102 in FIG. 1. Thus, the input trace provides an input of the buck converter package.

Turning to sync transistor 230, conductive epoxy 236 may couple the topside drain of sync transistor 230 to conductive clip 250, similarly as in FIG. 2B. On the bottom side, solder bump 234d corresponding to sync source pad 234d from FIG. 2A and solder bump 234e corresponding to sync source pad 234e from FIG. 2A are electrically and directly surface mounted on support surface 270. Solder bumps 234d and 234e may be coupled through a trace in support surface 270 and may, for example, connect to an additional power phase of a buck converter circuit.

Thus, FIGS. 2A, 2B, and 2C show that all the terminals of control transistor 220 and sync transistor 230 within package 210 are surface mountable to support surface 270. Control gate pad 222, control source pad 224a, control drain pad 226, sync gate pad 232, and sync source pads 234a, 234d, 234e are all electrically and directly surface mountable on support surface 270, providing access to the control gate, control source, control drain of control transistor 220 and the sync gate and sync source of sync transistor 230. While the cross sectional views of control source pad 224b and sync source pads 234b and 234c are not shown, it is to be understood that these pads are also electrically and directly surface mountable on support surface 270 as well. As previously described, "directly" indicates that each pad may be coupled directly, for example by solder, to the support surface without the use of intermediary structures such as a bond wire or a conductive clip. A sync drain of sync transistor 230 may be coupled by, for example, conductive epoxy 236, which is in electrical contact with the sync drain of transistor 230, to conductive clip 250. Conductive clip 250 has a peripheral rim surface 252, which may be surface mounted on support surface 270. Accordingly, all terminals are accessible and may be readily routed through traces within support surface 270, for example to complete the circuit in diagram 100 of FIG. 1.

Thus, vertical conduction buck converter power phase package has been described. According to the present invention, by using vertical conduction transistors including a control transistor with a control drain coupled to a bottom surface thereof, all terminals of the control transistor may be made accessible to a receiving support surface while retaining the current carrying advantage of vertical conduction devices, facilitating the integration of a buck converter power phase in a single package. Furthermore, by attaching a conductive clip to a sync transistor and by attaching the control transistor to the conductive clip by non-conductive epoxy, all terminals of the sync transistor may also be made accessible while conferring thermal advantages to the package. Since the control transistor and the sync transistor may be spaced laterally rather than stacked vertically, and since both transistors may be thermally coupled to a conductive clip, thermal dissipation may be greatly improved compared to conventional stacked package designs. A heatsink may be optionally attached to the conductive clip, further improving thermal dissipation. Additionally, a driver IC may be optionally integrated into the package, simplifying end user integration.

From the above description of the invention it is manifest that various techniques can be used for implementing the concepts of the present invention without departing from its scope. Moreover, while the invention has been described with specific reference to certain embodiments, a person of ordinary skills in the art would recognize that changes can be made in form and detail without departing from the spirit and the scope of the invention. As such, the described embodiments are to be considered in all respects as illustrative and not restrictive. It should also be understood that the invention is not limited to the particular embodiments described herein, but is capable of many rearrangements, modifications, and substitutions without departing from the scope of the invention.

The invention claimed is:

1. A high power semiconductor package comprising:
a vertical conduction control transistor comprising a control source and a control gate on a bottom surface thereof, and a control drain being electrically coupled to said bottom surface of said vertical conduction control transistor;
a vertical conduction sync transistor comprising a sync drain on a top surface thereof and a sync source and a sync gate on a bottom surface thereof;
wherein said control source, said control gate, and said control drain are electrically and directly surface mountable on a support surface.

2. The high power semiconductor package of claim 1, wherein said sync drain is coupled to said support surface through a conductive clip.

3. The high power semiconductor package of claim 1, wherein said control drain does not use a conductive clip for connection to said support surface.

4. The high power semiconductor package of claim 1, wherein said control drain does not use a bond wire for connection to said support surface.

5. The high power semiconductor package of claim 1, wherein said control source, said control gate, and said control drain do not use a conductive clip for connection to said support surface.

6. The high power semiconductor package of claim 1, wherein said control source, said control gate, and said control drain do not use a bond wire for connection to said support surface.

7. The high power semiconductor package of claim 1, further comprising a driver integrated circuit (IC) coupled to said control gate and said sync gate through said support surface.

8. A high power semiconductor package comprising:
a vertical conduction control transistor comprising a control source and a control gate on a bottom surface thereof, and a control drain being electrically coupled to said bottom surface of said vertical conduction control transistor;
a vertical conduction sync transistor comprising a sync drain on a top surface thereof and a sync source and a sync gate on a bottom surface thereof;
wherein said control source, said control gate, said control drain, said sync gate and said sync source are electrically and directly surface mountable on a support surface.

9. The high power semiconductor package of claim 8, wherein said sync drain is coupled to said support surface through a conductive clip.

10. The high power semiconductor package of claim 8, further comprising a conductive clip attached to said vertical conduction control transistor by a non-conductive epoxy.

11. The high power semiconductor package of claim 8, further comprising a conductive clip attached to a driver integrated circuit (IC) by a non-conductive epoxy.

12. The high power semiconductor package of claim 8, wherein said control drain is surface mounted to said support surface by solder.

13. The high power semiconductor package of claim 8, further comprising a driver integrated circuit (IC) coupled to said control gate and said sync gate through said support surface.

14. The high power semiconductor package of claim 8, wherein said support surface is a planar support surface.

15. The high power semiconductor package of claim 8, wherein said control drain is electrically coupled to said bottom surface using an implant sinker.

16. The high power semiconductor package of claim 8, wherein said control drain is electrically coupled to said bottom surface using a moat trench.

17. A buck converter package comprising:
a vertical conduction control transistor comprising a control source and a control gate on a bottom surface thereof, and a control drain being electrically coupled to said bottom surface of said vertical conduction control transistor;

a vertical conduction sync transistor comprising a sync drain on a top surface thereof and a sync source and a sync gate on a bottom surface thereof;

wherein said control source, said control gate, and said control drain are electrically and directly surface mountable on a support surface;

wherein said sync drain is coupled to said support surface through a conductive clip.

18. The buck converter package of claim 17, wherein an input of said buck converter is provided to said control drain by an input trace on said support surface, and wherein an output of said buck converter is provided by an output trace on said support surface connected to said control source and said sync drain.

19. The buck converter package of claim 17, further comprising a driver integrated circuit (IC) coupled to said control gate and said sync gate through said support surface.

20. The buck converter package of claim 17, wherein said conductive clip is attached to said vertical conduction control transistor by a non-conductive epoxy.

21. The buck converter package of claim 17, wherein said control source, said control gate, and said control drain do not use the conductive clip for connection to said support surface.

* * * * *